(12) United States Patent
Werner et al.

(10) Patent No.: US 9,455,232 B2
(45) Date of Patent: Sep. 27, 2016

(54) SEMICONDUCTOR STRUCTURE INCLUDING A DIE SEAL LEAKAGE DETECTION MATERIAL, METHOD FOR THE FORMATION THEREOF AND METHOD INCLUDING A TEST OF A SEMICONDUCTOR STRUCTURE

(71) Applicant: GLOBALFOUNDRIES Inc., Grand Cayman (KY)

(72) Inventors: Thomas Werner, Reichenberg-Moritzburg (DE); Frank Feustel, Dresden (DE); Oliver Aubel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/515,986

(22) Filed: Oct. 16, 2014

(65) Prior Publication Data

US 2016/0111381 A1    Apr. 21, 2016

(51) Int. Cl.
| | |
|---|---|
| H01L 23/00 | (2006.01) |
| H01L 23/31 | (2006.01) |
| H01L 21/768 | (2006.01) |
| H01L 21/02 | (2006.01) |
| H01L 21/66 | (2006.01) |
| H01L 23/58 | (2006.01) |
| H01L 23/522 | (2006.01) |
| H01L 23/532 | (2006.01) |

(52) U.S. Cl.
CPC ....... *H01L 23/564* (2013.01); *H01L 21/02118* (2013.01); *H01L 21/768* (2013.01); *H01L 22/14* (2013.01); *H01L 23/3171* (2013.01); *H01L 23/585* (2013.01); *H01L 23/522* (2013.01); *H01L 23/53295* (2013.01)

(58) Field of Classification Search
CPC ..... H01L 23/26; H01L 22/14; H01L 21/768; H01L 23/528; H01L 22/34; H01L 23/585
See application file for complete search history.

(56) References Cited

U.S. PATENT DOCUMENTS

| | | | | |
|---|---|---|---|---|
| 6,833,720 B1 * | 12/2004 | Daubenspeck | ...... | G01N 27/205 257/E23.002 |
| 2003/0173675 A1 * | 9/2003 | Watanabe | ................ | G03F 1/26 257/758 |
| 2009/0321734 A1 * | 12/2009 | Ogawa | ................... | H01L 22/34 257/48 |

\* cited by examiner

*Primary Examiner* — Joshua King
(74) *Attorney, Agent, or Firm* — Amerson Law Firm, PLLC

(57) ABSTRACT

A semiconductor structure includes a semiconductor substrate, one or more interconnect layers provided over the substrate and a circuit. The circuit includes a plurality of circuit elements formed at the substrate and a plurality of electrical connections provided in the one or more interconnect layers. A die seal is provided in the one or more interconnect layers. A die seal leakage detection material is arranged in the one or more interconnect layers between the die seal and the plurality of electrical connections. The die seal provides a protection of the die seal leakage detection material from moisture if the die seal is intact. The die seal leakage detection material is adapted for providing a detectable modification of the circuit after an exposure of the die seal leakage detection material to moisture.

16 Claims, 6 Drawing Sheets

SEMICONDUCTOR STRUCTURE INCLUDING A DIE SEAL LEAKAGE DETECTION MATERIAL, METHOD FOR THE FORMATION THEREOF AND METHOD INCLUDING A TEST OF A SEMICONDUCTOR STRUCTURE

BACKGROUND OF THE INVENTION

1. Field of the Invention

Generally, the present disclosure relates to the field of integrated circuits, and, in particular, to integrated circuits wherein die seals are used for protecting the integrated circuit from environmental influences.

2. Description of the Related Art

Integrated circuits include a number of individual circuit elements, such as, for example, transistors, capacitors, diodes and resistors, which are interconnected by means of electrically conductive metal lines formed in a dielectric material. The electrically conductive metal lines may be provided in a plurality of interconnect layers that are stacked on top of each other above a substrate. Metal lines in different interconnect layers may be electrically connected with each other by means of contact vias that are filled with metal. In and on the substrate, field effect transistors and, optionally, other circuit elements, such as capacitors, diodes and resistors, may be formed. Contact holes filled with an electrically conductive metal may be used for connecting the circuit elements with electrically conductive metal lines.

For forming the electrically conductive metal lines, damascene techniques may be employed. In damascene techniques, trenches and contact vias are formed in an intermetal dielectric, which may include silicon dioxide and/or a low-k material having a smaller dielectric constant than silicon dioxide. In the trenches and contact vias, a diffusion barrier layer may be formed. After the formation of the diffusion barrier layer, the trenches and contact vias may be filled with a metal such as copper or a copper alloy. This may be done by means of electroplating for depositing the metal and chemical mechanical polishing for removing portions of the metal deposited outside the trenches and contact vias.

For protecting the electrically conductive metal lines and other features in an integrated circuit from environmental influences, such as moisture, die seals may be employed. A die seal may include trenches filled with a metal that may be substantially the same metal as the metal from which the electrically conductive metal lines are formed. The trenches may be provided on top of each other in the interconnect layers so that a "wall" of metal is formed. The die seal may have a rectangular configuration that encloses the electrically conductive metal lines.

Issues that can occur in integrated circuits as described above may include a formation of defects and/or delaminations in interconnect layers that may be associated with leakages of a die seal. Relatively small defects and/or delaminations may remain undetected in tests that are performed during and/or after the manufacturing of the integrated circuits, but they can lead to a relatively quick failure of products wherein the integrated circuits are included.

In view of the situation described above, the present disclosure provides semiconductor structures and methods which may help to substantially avoid or at least reduce the occurrence of issues as described above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a semiconductor substrate, one or more interconnect layers provided over the substrate and a circuit. The circuit includes a plurality of circuit elements formed at the substrate and a plurality of electrical connections provided in the one or more interconnect layers. A die seal is provided in the one or more interconnect layers. A die seal leakage detection material is arranged in the one or more interconnect layers between the die seal and the plurality of electrical connections. The die seal provides a protection of the die seal leakage detection material from moisture if the die seal is intact. The die seal leakage detection material is adapted for providing a detectable modification of the circuit after an exposure of the die seal leakage detection material to moisture.

An illustrative method disclosed herein includes providing a semiconductor structure. The semiconductor structure includes a semiconductor substrate, one or more interconnect layers provided over the substrate and a circuit. The circuit includes a plurality of circuit elements formed at the substrate and a plurality of electrical connections provided in the one or more interconnect layers. A die seal is provided in the one or more interconnect layers. A die seal leakage detection material is provided in the one or more interconnect layers between the die seal and the plurality of electrical connections. The die seal provides a protection of the die seal leakage detection material from moisture if the die seal is intact. The die seal leakage detection material is configured for providing at least one defect of the circuit after an exposure of the die seal leakage detection material to moisture. The method further includes exposing the semiconductor structure to moisture. After exposing the semiconductor structure to moisture, a test of the semiconductor structure is performed for detecting if the circuit has a defect.

Another illustrative method disclosed herein includes providing a semiconductor substrate. A plurality of circuit elements are formed at the substrate. A plurality of interconnect layers are formed over the substrate. In the plurality of interconnect layers, a plurality of electrical connections connecting the circuit elements are formed. A die seal is formed in the one or more interconnect layers. A die seal leakage detection material is provided in the one or more interconnect layers between the die seal and the plurality of electrical connections. The die seal provides a protection of the die seal leakage detection material from moisture if the die seal is intact. The die seal leakage detection material is configured for providing a detectable modification of the circuit after an exposure of the die seal leakage detection material to moisture.

BRIEF DESCRIPTION OF THE DRAWINGS

The disclosure may be understood by reference to the following description taken in conjunction with the accompanying drawings, in which like reference numerals identify like elements, and in which.

Figure 1:
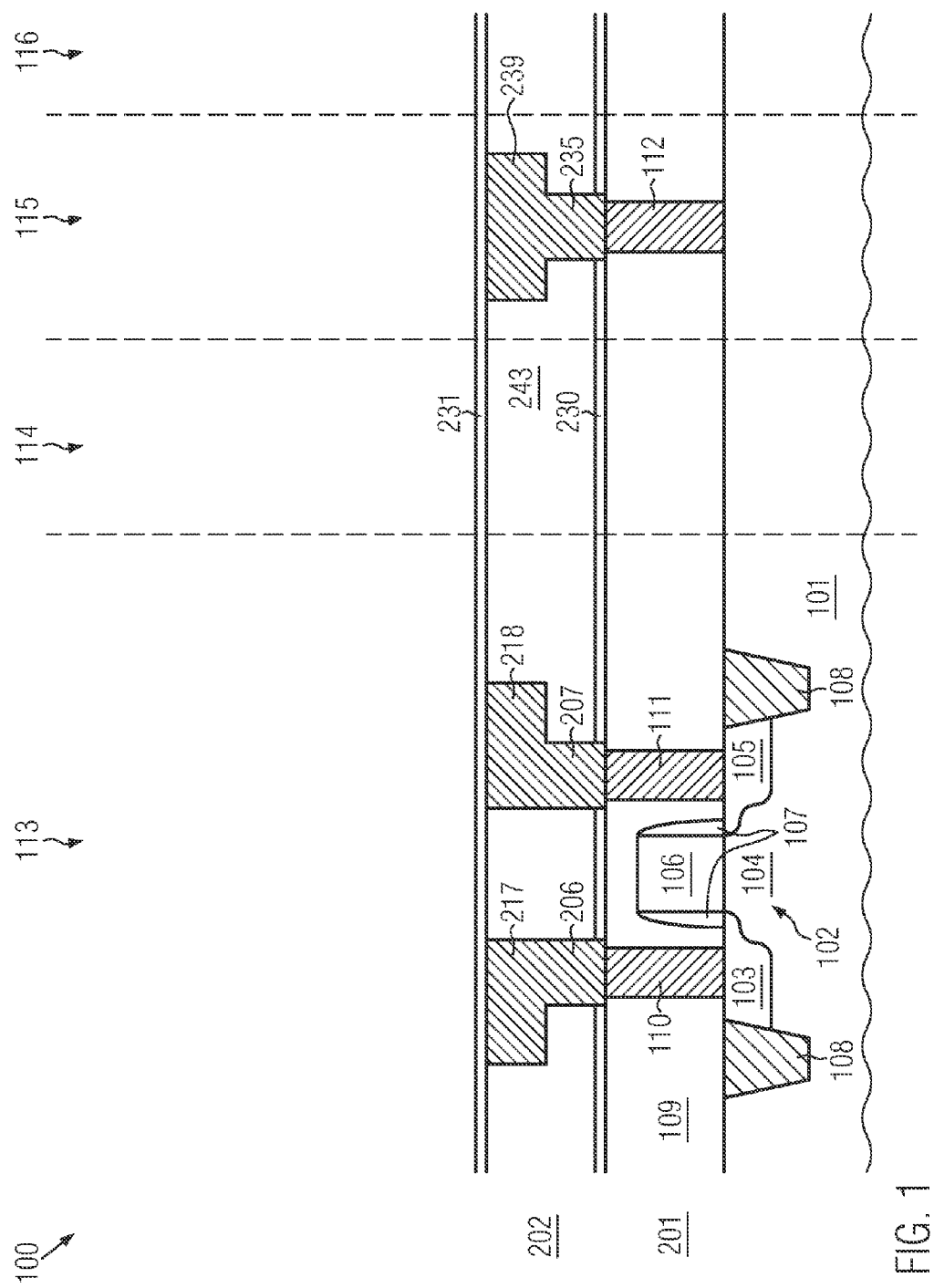
FIGS. 1-6 show schematic cross-sectional views of a semiconductor structure according to an embodiment in stages of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In embodiments disclosed herein, a sacrificial trench is inserted between a die seal and a die area in a relatively late stage of back end of line processing. The trench may be covered by a passivation, and it may reach from portions of the integrated circuit that are processed in front end of line processing to a last one of a plurality of layers that are formed in back end of line processing. The trench may be filled with a die seal leakage detection material which expands when exposed to moisture, in particular to humidity. In some embodiments, the die seal leakage detection material may include a polyimide.

During a stress test, a die including the integrated circuit may be exposed to moisture. If there is a defect in the die seal, the moisture can reach the sacrificial trench, leading to an expansion of the sacrificial trench that destroys the die. The defective die can be detected easily and removed. Thus, defects and/or die seal instabilities can be detected relatively early, prior to the shipment of the integrated circuit.

FIG. 1 shows a schematic cross-sectional view of a semiconductor structure 100 in a stage of a method for manufacturing the semiconductor structure 100. The semiconductor structure 100 includes a substrate 101. The substrate 101 may be a bulk semiconductor wafer formed of a semiconductor material such as silicon. In other embodiments, the substrate 101 may be a semiconductor-on-insulator (SOI) wafer that includes a layer of a semiconductor material, such as silicon, that is formed over a layer of electrically insulating material, such as silicon dioxide. The layer of electrically insulating material may be provided over a support wafer, which may be a silicon wafer.

At the substrate 101, circuit elements such as transistors, capacitors, diodes and/or resistors may be provided. As an example of a circuit element formed at the substrate 101, FIG. 1 shows a field effect transistor 102. The transistor 102 includes a source region 103, a channel region 104 and a drain region 105. Depending on the type of the transistor 102, both the source region 103 and the drain region 105 may be N-doped or P-doped, and the channel region 104 may be doped inversely to the source region 103 and the drain region 105. Over the channel region 104, a gate electrode 106 may be provided, which may be flanked by a sidewall spacer structure 107. A trench isolation structure 108 may provide electrical insulation between the transistor 102 and other circuit elements formed at the substrate 101.

The transistor 102 and other circuit elements that may be part of an integrated circuit, such as, for example, a processor, a memory chip or a system-on-a-chip, may be arranged in a die area 113. The die area 113 is a portion of the semiconductor structure 100 wherein the circuitry of the integrated circuit will be formed. The die area 113 may have a generally rectangular shape. In addition to the die area 113, the semiconductor structure 100 may include other die areas, which may have a configuration corresponding to that of the die area 113. Between adjacent die areas, scribe line areas may be provided. In FIG. 1, reference numeral 116 denotes one scribe line area which, in the view of FIG. 1, is arranged at the right of the die area 113. Further scribe line areas, which are not shown in FIG. 1, may be arranged at the left of the die area 113 and at sides of the die area 113 which are opposite along a direction that is perpendicular to the plane of drawing of FIG. 1. Thus, the die area 113 may be surrounded by scribe line areas 116.

In later stages of the manufacturing of the semiconductor structure 100, the integrated circuit that will be formed in the die area 113 may be separated from other integrated circuits that are formed on the substrate 101 by cutting the substrate 101 along each of the scribe lines. In doing so, a number of individual semiconductor structures, which are denoted as "dies," may be formed. Herein, the term "semiconductor structure" will be used as a general term for denoting both structures including a wafer such as the substrate 101 and individual dies.

Between the scribe line area 116 and the die area 113, a die seal area 115 and a trench area 114 may be provided. The die seal area 115, wherein a die seal for protecting the die area 113 from environmental influences, such as, for example, moisture, will be formed, may be arranged closer to the scribe line area 116 than the trench area 114 so that the trench area 114 is located between the die area 113 and the die seal area 115.

The die seal area 115 and the trench area 114 may extend along each of the scribe lines that are arranged around the die area 113 so that the die area 113 is annularly enclosed by the trench area 114 and the die seal area 115. The trench area 114 and the die seal area 115 may have a generally rectangular ring shape, wherein the trench area 114 surrounds the die area 113 in a frame-like manner, and the die seal area 115 surrounds the die area 113 and the trench area 114 in a frame-like manner.

Above the substrate 101, a premetal dielectric 109, which may be formed of an electrically insulating material such as silicon dioxide, may be provided. In the premetal dielectric 109, contact holes 110, 111, which may be filled with an electrically conductive metal such as tungsten, may be provided in the die area 113. The contact hole 110 may be provided over the source region 103 of the transistor 102 for providing an electrical connection to the source region 103, and the contact hole 111 may be provided over the drain region 105 for providing an electrical connection to the drain region 105.

In the die seal area 115, a trench 112 may be provided. The trench 112 may have a width that is approximately equal to a diameter of the contact holes 110, 111, and it may extend around the die area 113, so that the trench 112 annularly encloses the die area 113. The trench 112 may be filled with an electrically conductive metal, which may be the same metal as the metal provided in the contact holes 110, 111.

Over the premetal dielectric 109, a capping layer 230 may be provided. The capping layer 230 may be formed of an electrically insulating material that is a different material than the material of the premetal dielectric 109. In embodiments wherein the premetal dielectric 109 includes silicon dioxide, the capping layer 230 may include silicon nitride.

The premetal dielectric 109, the contact holes 110, 111, the trench 112 and the capping layer 230 are provided in a first interconnect layer 201 of the semiconductor structure 100.

Over the capping layer 230, an intermetal dielectric 243 may be provided. In some embodiments, the intermetal dielectric 243 may be formed of a low-k material having a dielectric constant that is smaller than the dielectric constant of silicon dioxide, for example, a fluorosilicate glass, a carbon-doped silicon dioxide, a porous silicon dioxide, a porous carbon-doped silicon dioxide, a hydrogen silsesquioxane, a methylsilsesquioxane, a polynorbornene, a benzocyclobutene and/or a polytetrafluoroethylene. Alternatively, the intermetal dielectric 243 may be formed of silicon dioxide.

In the intermetal dielectric 243, trenches 217, 218 and contact vias 206, 207 may be provided. The trenches 217, 218 and the contact vias 206, 207 may be filled with a metal including copper, for example, copper or a copper alloy. The contact via 206 filled with metal may provide an electrical connection between the metal in the trench 217 and the contact hole 110, so that an electrical connection between the metal in the trench 217 and the source region 103 of the transistor 102 is provided.

The metal in the contact via 207 may provide an electrical connection between the metal in the trench 218 and the contact hole 111 so that an electrical connection between the metal in the trench 218 and the drain region 105 of the transistor 102 is provided.

Further contact vias that are provided in the intermetal dielectric 243 may provide electrical connections between the metal in the trench 217 and circuit elements other than the transistor 102 which are formed at the substrate 101 in the die area 113 through contact holes other than the contact holes 110, 111. Similarly, the metal in the trench 218 may be electrically connected to circuit elements other than the transistor 102 through contact vias and/or contact holes.

The semiconductor structure 100 may further include a via trench 235. The via trench 235 may be provided over the trench 112, and it may have a shape that substantially corresponds to the shape of the trench 112. A width of the via trench 235 may be approximately equal to a diameter of the contact vias 206, 207. Over the via trench 235, a trench 239 may be provided. A shape of the trench 239 may generally correspond to a shape of the trench 112 and the via trench 235 wherein, however, a width of the trench 239 may be greater than the widths of the trench 112 and the via trench 235. The via trench 235 and the trench 239 may be filled with a metal, which may be the same metal as the metal provided in the contact vias 206, 207 and the trenches 217, 218. In particular, the via trench 235 and the trench 239 may be filled with a metal including copper, such as substantially pure copper or a copper alloy.

Over the intermetal dielectric 243 and the trenches 217, 218, 239, a capping layer 231 may be provided. The capping layer 231 may be formed of substantially the same material as the capping layer 230, for example, silicon nitride.

The intermetal dielectric 243, the trenches 217, 218, 239, the contact vias 206, 207, 235 and the capping layer 231 are provided in a second interconnect layer 202 of the semiconductor structure 100.

The features of the semiconductor structure 100 shown in FIG. 1 may be formed as follows.

The trench isolation structure 108 may be formed by means of techniques of forming shallow trench isolation structures, which may include photolithography, etching and processes of oxidation, deposition and/or chemical mechanical polishing. Moreover, techniques of ion implantation, deposition and etching may be employed for forming the source region 104, the drain region 105, the gate electrode 106 and the sidewall spacer structure 107 of the transistor 102. Techniques for the formation of transistors and shallow trench isolation structures are known, and a detailed description thereof herein will be omitted.

Thereafter, the premetal dielectric 109 may be deposited over the semiconductor structure 100 using deposition processes such as chemical vapor deposition and/or plasma enhanced chemical vapor deposition. The as-deposited premetal dielectric 109 may have a relatively uneven surface. In particular, the surface of the premetal dielectric 109 may have bumps over features extending above the surface of the substrate 101, such as the gate electrode 106. Therefore, after the deposition of the premetal dielectric 109, a chemical mechanical polishing process may be performed for planarizing the surface of the premetal dielectric 109.

Then, the contact holes 110, 111 and the trench 112 may be formed in the premetal dielectric 109. For this purpose, a photomask that covers the premetal dielectric 109 with the exception of those locations where the contact holes 110, 111 and the trench 112 are to be provided may be formed using techniques of photolithography. Then, an etch process adapted to remove the material of the premetal dielectric 109, for example a dry etch process, may be performed. Thereafter, the photomask may be removed, and a deposition process may be performed for depositing a metal such as tungsten that is used for filling the contact holes 110, 111 and the trench 112. Portions of the metal outside the contact holes 110, 111 and the trench 112 may be removed by a chemical mechanical polishing process.

Thereafter, the capping layer 230 may be deposited, for example by means of a chemical vapor deposition process or a plasma enhanced chemical vapor deposition process, and the intermetal dielectric 243 may be deposited over the capping layer 230. Depending on the material of the intermetal dielectric 243, chemical vapor deposition, plasma enhanced chemical vapor deposition or spin coating may be employed for depositing the intermetal dielectric 243.

Thereafter, a damascene process may be performed for forming the contact vias 206, 207, the via trench 235 and the trenches 217, 218, 239 filled with the metal including copper.

The contact vias 206, 207, the via trench 235 and the trenches 217, 218, 239 may be formed by means of techniques of photolithography and etching. In some embodiments, a trench first approach may be used, wherein the trenches 217, 218, 239 are formed before the formation of the contact vias 206, 207 and the via trench 235. In other embodiments, a via first approach may be used, wherein, first, the contact vias 206, 207 and the via trench 235 are formed, and, thereafter, the trenches 217, 218, 239 are formed. The formation of the contact vias 206, 207 and the via trench 235 may include a first etch process that is adapted to remove the material of the intermetal dielectric 243, and a second etch process that is adapted for removing the material of the capping layer 230 so that the metal in the contact holes 110, 111 and the trench 112 is exposed at the bottom of the contact vias 206, 207 and the via trench 235.

Thereafter, a diffusion barrier layer (not shown in FIG. 1) may be deposited over the semiconductor structure 100, and an electroplating process may be performed for filling the contact vias 206, 207, the via trench 235 and the trenches 217, 218, 239 with the metal including copper. Thereafter, a chemical mechanical polishing process may be performed for removing portions of the diffusion barrier layer and the metal outside the contact vias 206, 207, the via trench 235 and the trenches 217, 218, 239.

Then, a capping layer 231 may be deposited over the semiconductor structure 100. The capping layer 231 may be formed of substantially the same material as the capping layer 230, for example, silicon nitride.

Among the processing steps described above, those employed for the formation of the transistor 102 and other circuit elements at the substrate are part of the so-called "front end of line processing," and the processing steps employed for forming the features in the interconnect layers 201, 202, as well as any later processing steps that will be described below, are part of the so-called "back end of line processing."

Figure 2:
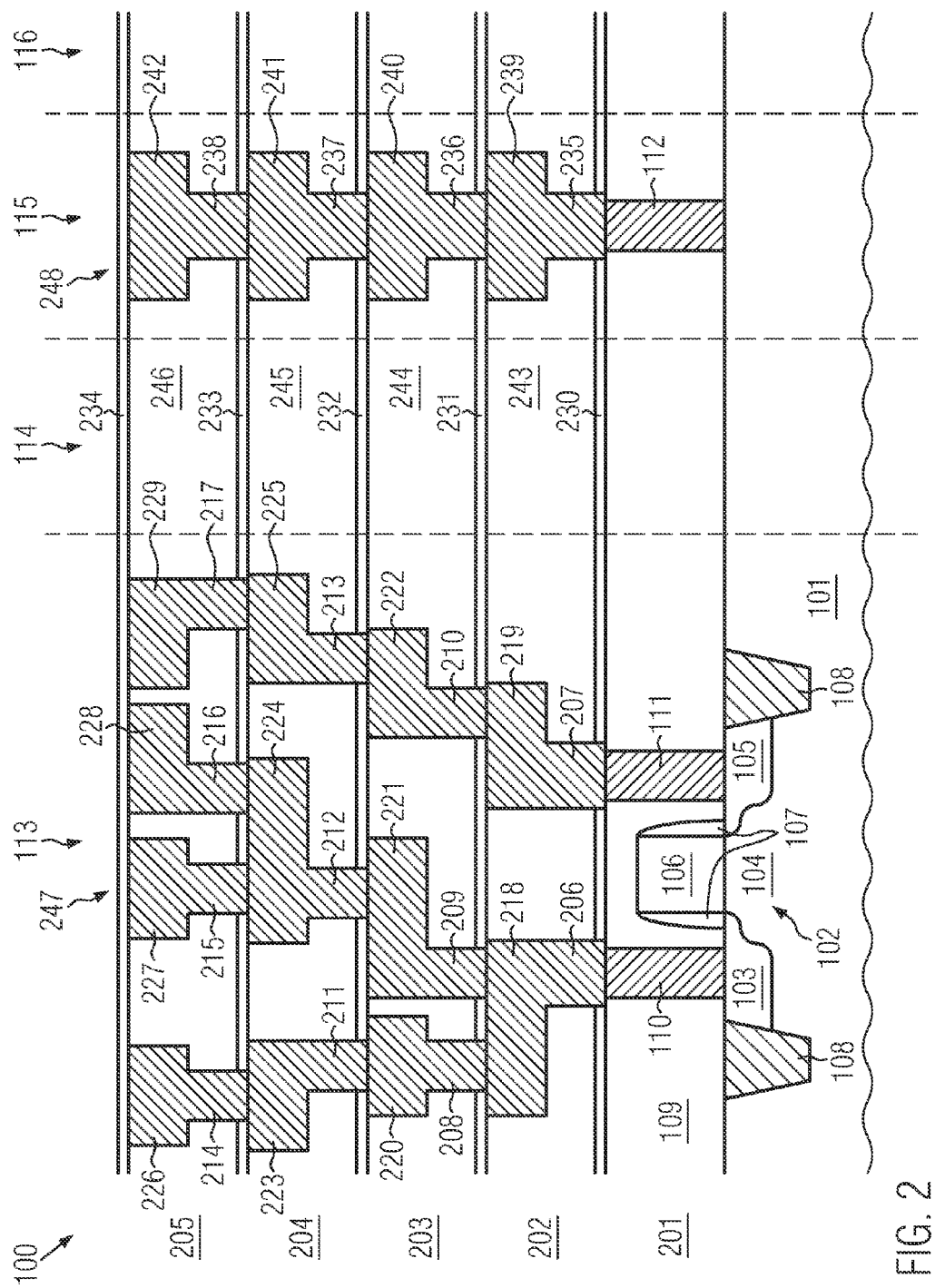

FIG. 2 shows a schematic cross-sectional view of the semiconductor structure 100 in a later stage of the manufacturing process. After the formation of the second interconnect layer 202, a third interconnect layer 203, a fourth interconnect layer 204 and a fifth interconnect layer 205 may be formed.

Each of the interconnect layers 203, 204, 205 may include an intermetal dielectric, wherein, in FIG. 2, the intermetal dielectrics of the interconnect layers 203, 204, 205 are denoted by reference numerals 244, 245 and 246, respectively. Each of the interconnect layers 203, 204, 205 may also include a capping layer, wherein, in FIG. 2, the capping layers are denoted by reference numerals 232, 233 and 234.

The third interconnect layer 203 may include contact vias 208, 209, 210 and trenches 220, 221, 222. Similarly, the fourth interconnect layer 204 may include contact vias 211, 212, 213 as well as trenches 223, 224, 225, and the fifth interconnect layer 205 may include contact vias 214, 215, 216, 217 and trenches 226, 227, 228, 229. Each of the contact vias 208 to 217 may provide an electrical connection between one of the trenches in the interconnect layer wherein the respective contact via is located and another trench that is located in the interconnect layer below the interconnect layer wherein the respective contact via is located.

The arrangement of contact vias 206 to 217 and trenches 218 to 229 in the interconnect layers 202 to 205 and the contact holes 110, 111 in the interconnect layer 201 form an arrangement of electrical connections 247 that connect circuit elements formed at the substrate 101 such as, for example, the transistor 102 and other circuit elements with each other. The electrical connections 247 include electrically conductive metal lines that are formed by the metal in the trenches 218 to 229. The electrical connections in the interconnect layers 201 to 205 and the circuit elements formed at the substrate 101 form a circuit in the die area 113.

Each of the third interconnect layer 203, the fourth interconnect layer 204 and the fifth interconnect layer 205 may also include a via trench similar to the via trench 235 described above with reference to FIG. 1 and a trench similar to the trench 239 described above. In FIG. 2, the via trenches are denoted by reference numerals 236, 237, 238, and the trenches are denoted by reference numerals 240, 241, 242. Each of the via trenches 236, 237, 238 may be located above a respective one of the trenches 239 to 241 in the interconnect layer below the interconnect layer wherein the respective via trench is provided. Furthermore, each of the trenches 240, 241, 242 may be located above a respective one of the via trenches 236, 237, 238 in the same interconnect layer. Each of the via trenches 236, 237, 238 may have a shape corresponding to that of the via trench 235, and each of the trenches 240, 241, 242 may have a shape corresponding to that of the trench 239.

Thus, the arrangement of the via trenches 235 to 238, the trenches 239 to 242 and the trench 112 in the die seal area 115 may form a die seal 248 that is substantially comprised of metal, extends around the die area 113 and the trench area 114 and annularly encloses the die area 113 and the trench area 114. Since the die seal 248 is substantially comprised of metal, the die seal 248 may substantially prevent an entry of environmental influences such as moisture, in particular humidity, through the die seal 248 if the die seal 248 is intact. Moreover, the die seal 248 may have a greater mechanical stability than the premetal dielectric 109 and/or the intermetal dielectrics 243 to 246. Thus, the die seal 248 may contribute to the mechanical stability of the semiconductor structure 100.

The arrangement of the contact vias 206 to 217 and the trenches 218 to 229 shown in FIG. 2 is of an exemplary nature. Furthermore, in alternative embodiments, a greater or smaller number of intermetal layers may be provided.

Figure 3:
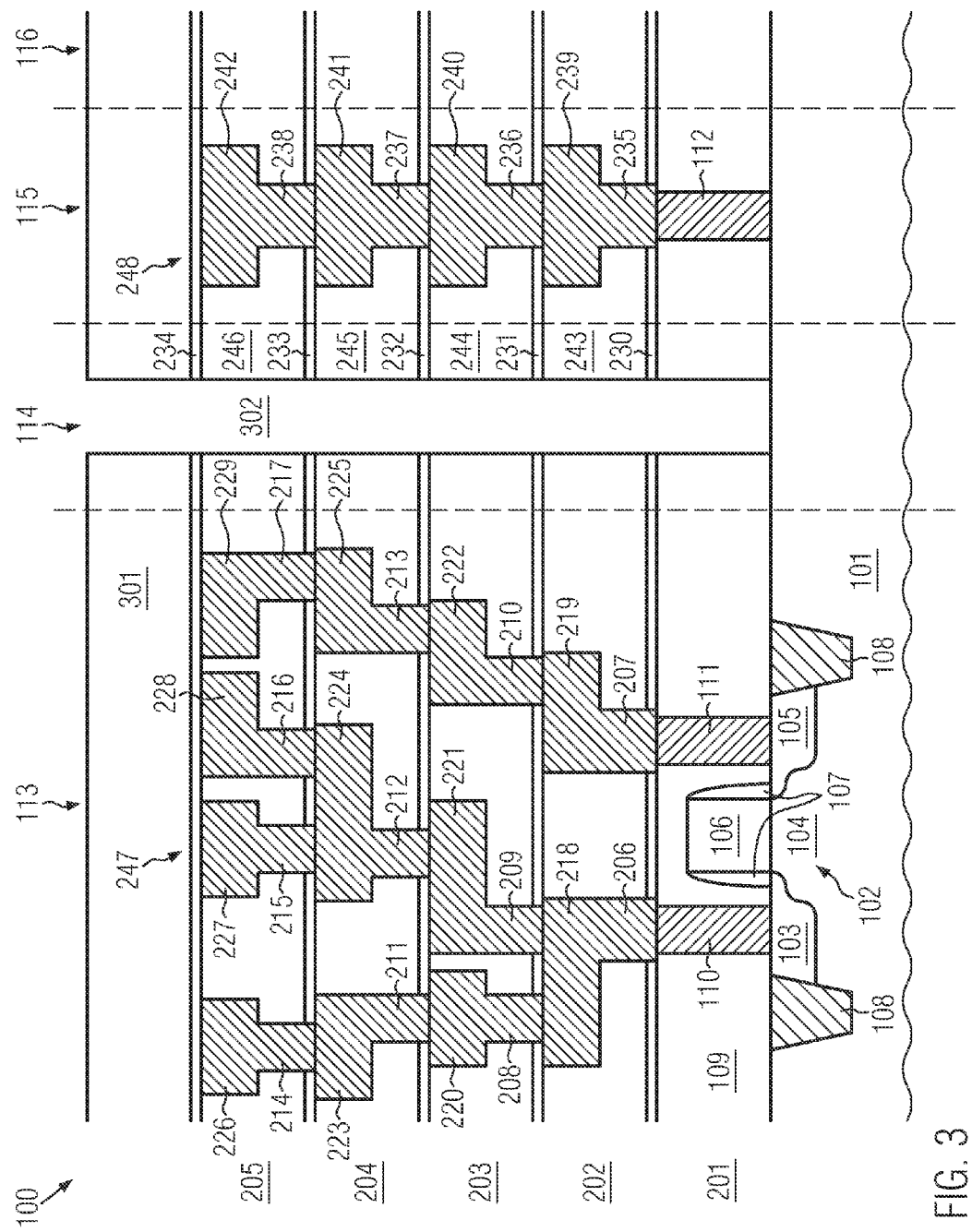

FIG. 3 shows a schematic cross-sectional view of the semiconductor structure 100 in a later stage of the manufacturing process. A mask 301 may be formed over the semiconductor structure 100. In some embodiments, the mask 301 may be a photoresist mask, and it may be formed by means of a photolithography process. In other embodiments, the mask 301 may be a hardmask, and it may be formed of silicon dioxide and/or silicon nitride. In some embodiments, the mask 301, when being a hardmask, may be formed by depositing one or more layers of one or more hardmask materials over the semiconductor structure 100 and patterning the one or more layers of hardmask material. For patterning the one or more layers of hardmask material, a photoresist mask may be formed by means of a photolithography process. Then, one or more etch processes adapted to remove the hardmask material, for example dry etch processes, may be performed. Thus, a hardmask having a pattern corresponding to that of the photoresist mask may be formed. Thereafter, the photoresist mask may be removed by means of a resist strip process.

After the formation of the mask 301, one or more etch processes that are adapted for removing the materials of the cap layers 230 to 234, the intermetal dielectrics 243 to 246 and the premetal dielectric 109 may be performed. The one or more etch processes may be dry etch processes providing a relatively high degree of anisotropy of the etching. In some embodiments, reactive ion etching may be employed.

In the one or more etch processes, portions of the cap layers 230 to 234, the interlayer dielectrics 243 to 246 and the premetal dielectric 109 that are not covered by the mask 301 may be removed. Due to the anisotropy of the one or more etch processes, substantially no material of the semiconductor structure 100 below the mask 301 is removed so that a trench 302 extending through each of the interconnect layers 201 to 205 and having relatively steep and/or substantially vertical walls is obtained.

After the one or more etch processes that are employed for forming the trench 302, the semiconductor material of the substrate 101 may be exposed at the bottom of the trench 302. Thus, the trench 302 may extend from the substrate 101 to the interconnect layer 205. Among the interconnect layers 201 to 205, the interconnect layer 205 is the top interconnect layer, that is, arranged at the greatest distance to the substrate 101.

The bottom of the trench 302 need not be arranged at the same level as the upper interface of portions of the substrate 101 below the premetal dielectric 109, as shown in FIG. 3. In other embodiments, a certain amount of overetching may be performed in the formation of the trench 302 so that the trench 302 extends into the semiconductor material of the substrate 101.

In further embodiments, an amount of material above the semiconductor material of the substrate 101 may remain at the bottom of the trench 302, for example material of the premetal dielectric 109, having a thickness being less than a fraction (for example, less than one-half, less than one-quarter and/or less than one-tenth) of the thickness of the premetal dielectric 109.

In further embodiments, a liner layer (not shown) that is formed of a different material than the premetal dielectric 109 may be provided below the premetal dielectric 109. For example, in embodiments wherein the premetal dielectric 109 includes silicon dioxide, the liner layer may include silicon nitride. In such embodiments, the liner layer may be used as an etch stop layer in the etching of the trench 302, and it may remain at the bottom of the trench 302. A thickness of the liner layer may be smaller than the thickness of the premetal dielectric 109.

The trench 302 is provided in the trench area 114, between the die area 113 and the die seal area 115. The trench 302 may extend through the entire trench area 114 so that the trench 302 extends all around the die area 113 and annularly encloses the die area 113.

Figure 4:
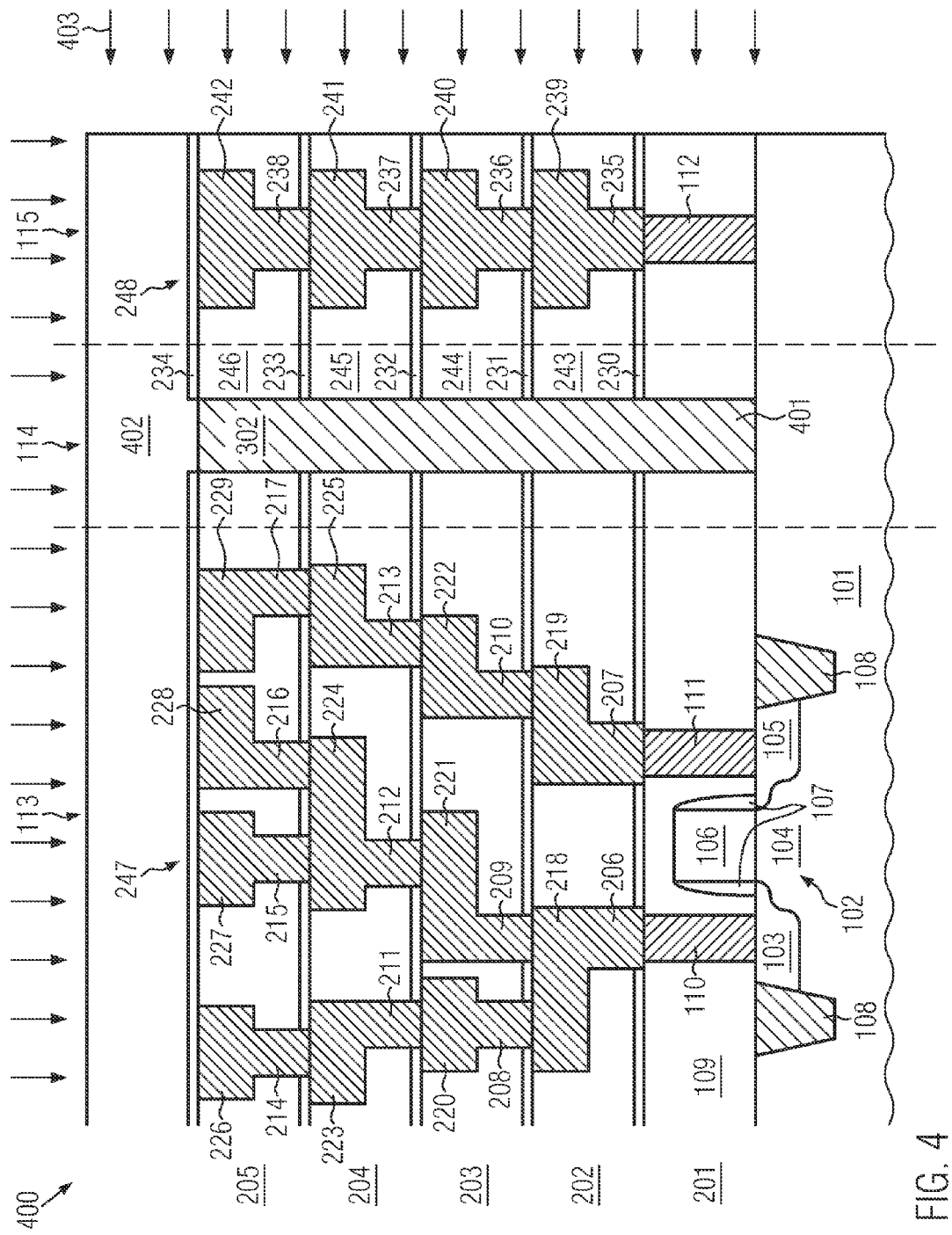

FIG. 4 shows a schematic cross-sectional view of the semiconductor structure 100 in a later stage of the manufacturing process. After the one or more etch processes that are performed for forming the trench 302, the mask 301 may be removed. In embodiments wherein the mask 301 is a photoresist mask, this may be done by means of a resist strip process. In embodiments wherein the mask 301 is a hardmask, the mask 301 may be removed by means of one or more etch processes that are adapted to remove the one or more hardmask materials. Thereafter, the trench 302 may be filled with a die seal leakage detection material 401.

The die seal leakage detection material 401 may be a material wherein at least one property of the die seal leakage detection material changes when the die seal leakage detection material is exposed to moisture. In particular, in some embodiments, the die seal leakage detection material 401 may be a material that is configured to expand after an exposure of the die seal leakage detection material 401 to moisture. In some of these embodiments, the die seal leakage detection material 401 may include a polyimide such as, for example, poly(4,4'-oxydiphenylene-pyromellitimide), available as "Kapton K" from DuPont.

Polyimides are hydroscopic, and properties of polyimides may change when the polyimide absorbs water. In particular, polyimides that have absorbed water may expand so that a volume of a certain amount of polyimide that has absorbed water may be greater than a volume of the same amount of dry polyimide.

The amount of expansion of a hydroscopic material upon absorption of water may be expressed in terms of the so-called "hydroscopic coefficient of expansion," which is a relative change of a length of the hydroscopic material per weight percent of absorbed water in the absence of an external stress. If the material cannot freely expand and is confined to a volume, the material may create a stress when it is exposed to moisture.

For filling the trench 302 with polyimide, a liquid precursor of the polyimide may be deposited over the semiconductor structure 100 by means of spin coating. Thereafter, a curing process, wherein the semiconductor structure 100 is exposed to an elevated temperature, for example a temperature in a range from about 100-350° C., may be performed. In the curing process, the polyimide is formed.

Thereafter, polyimide outside the trench 302 may be removed, for example, by means of an etch process, such as a reactive ion etch process or by chemical mechanical polishing.

After filling the trench 302 with the die seal leakage detection material 401, a passivation layer 402 may be formed over the semiconductor structure 100. The passivation layer 402 may be formed of silicon dioxide and/or silicon nitride, and it may be deposited by means of a chemical vapor deposition process or a plasma enhanced chemical vapor deposition process.

Thereafter, a separation process may be performed, wherein the semiconductor structure 100 is cut into a number of individual dies by cutting along scribe lines of the semiconductor structure 100, which include the scribe line 116 which is exemplarily shown in FIGS. 1-3. The separation process may be performed in accordance with conventional techniques for separating a semiconductor wafer into individual dies, which include cutting the semiconductor structure 100 by means of a diamond-impregnated rotating dicing saw.

Figure 5:
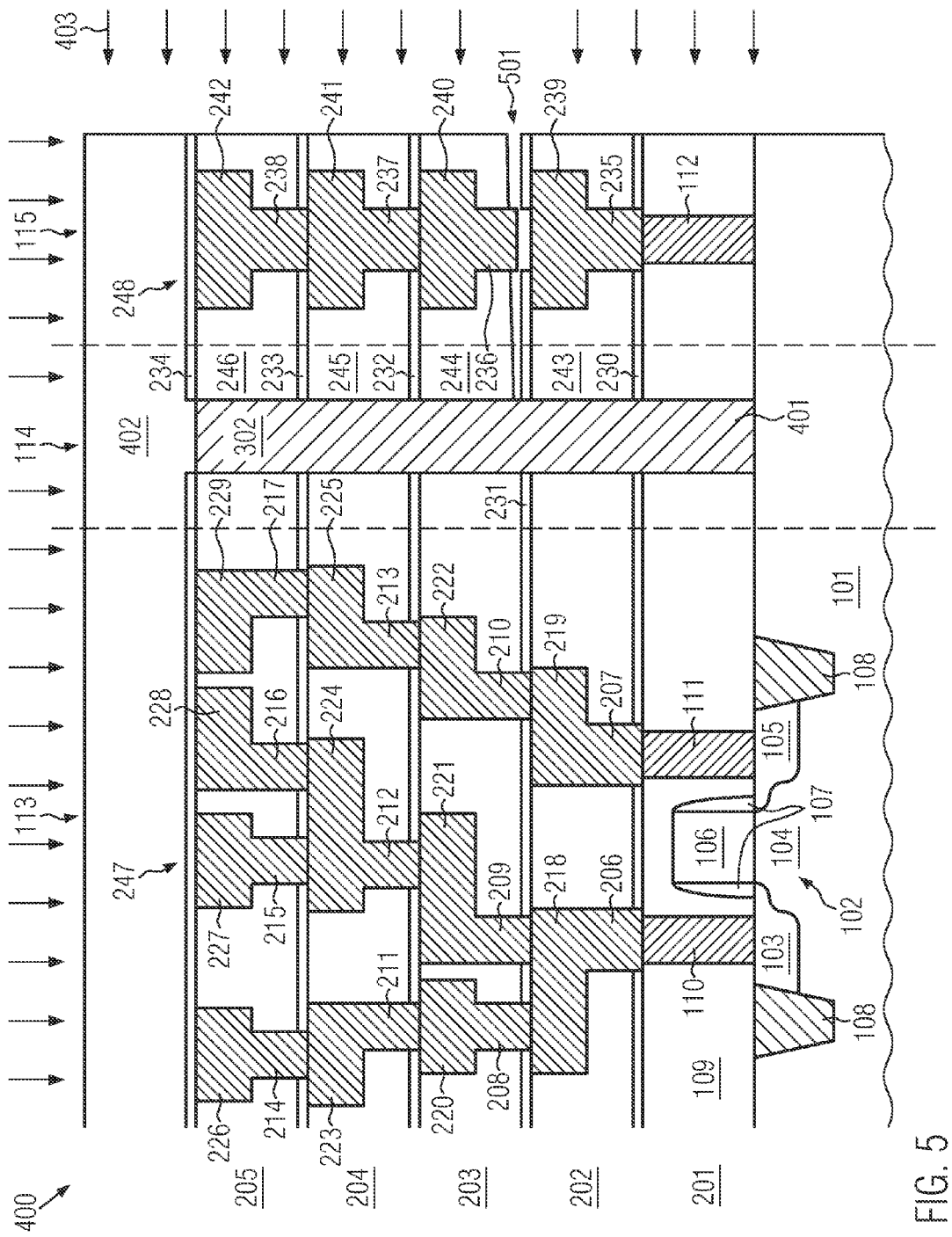
Figure 6:
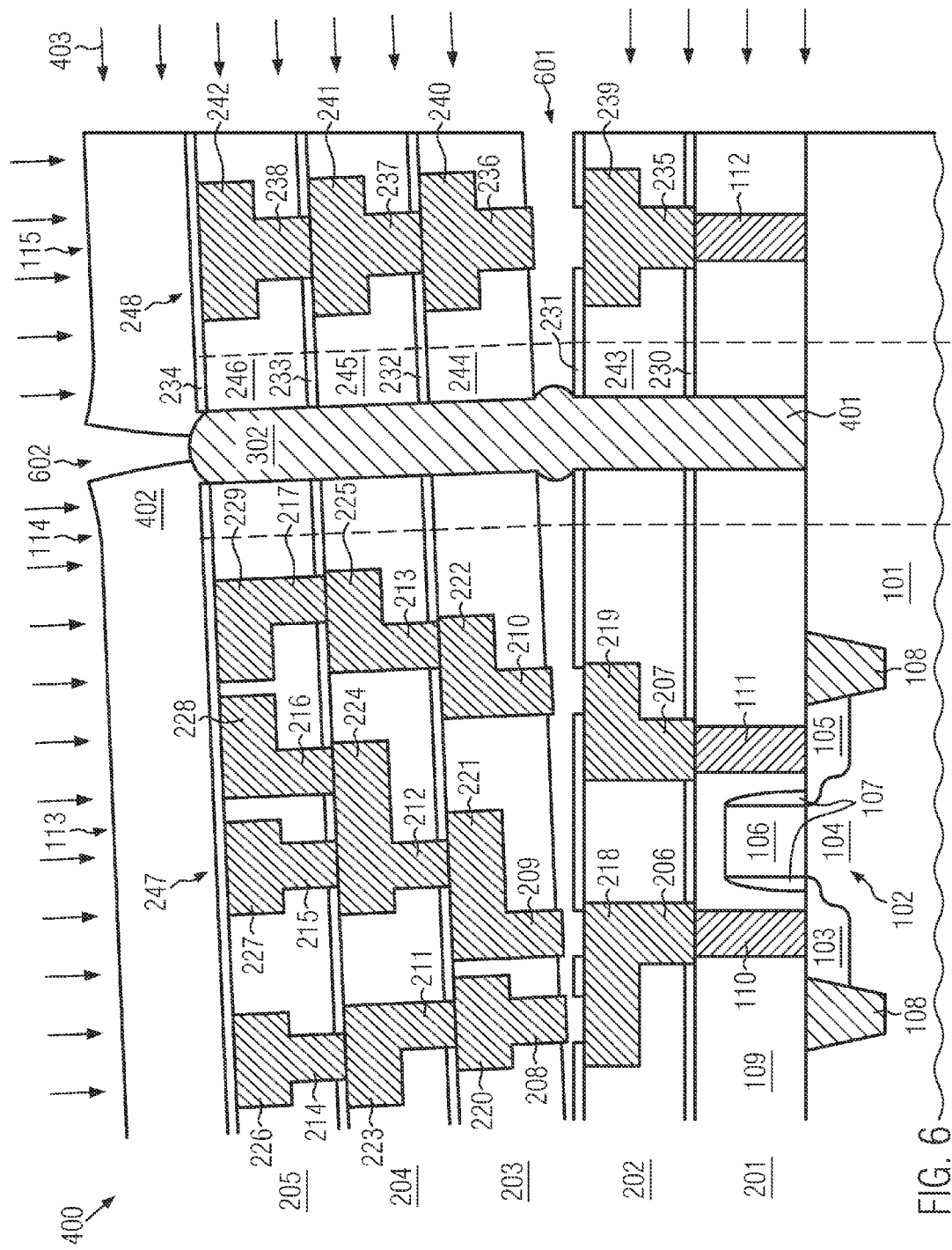

In FIGS. 4-6, the reference numeral 400 will be used for denoting the die that is obtained by cutting the semiconductor structure 100 and includes the die area 113, the trench area 114 and the die seal area 115. Accordingly, the semiconductor structure 400, which will be referred to in the following, may comprise one of the dies that are obtained by cutting the semiconductor structure 100. However, the present disclosure is not limited to embodiments wherein the semiconductor structure 400 is an unpackaged die. In other embodiments, the die obtained by cutting the semiconductor structure 100 may be provided in a package before exposing it to moisture and performing an electrical test as described below.

As already detailed above, when the die seal 248 is intact, the die seal 248 typically has substantially no permeability for moisture. Similarly, the cap layer 234 and the passivation layer 402, which may be formed of silicon dioxide and/or silicon nitride, typically has substantially no permeability for moisture. Accordingly, when the die seal 248 is intact, the die seal leakage detection material 401 is protected from moisture that is external to the semiconductor structure 400, even if the semiconductor structure 400 is provided in an environment wherein moisture is present. Thus, substantially no expansion of the die seal leakage detection material 401, which, as detailed above, may be caused by the absorption of moisture by the die seal leakage detection material 401, is obtained. However, if there is a leak of the die seal 248, moisture can reach the die seal leakage detection material 401 and an expansion thereof may be obtained.

After separating the wafer 100 into individual dies, a stress test may be performed, wherein the semiconductor structure 400 is exposed to moisture, as schematically denoted by arrows 403 in FIG. 4. This may be done by exposing the semiconductor structure 400 to humid air at an elevated temperature that is greater than the room temperature (20° C.). For example, the semiconductor structure 400 may be exposed to air having a relative humidity of up to 100% at a temperature in a range from about 100-250° C. The stress test may be performed for a time in a range from about 1 second to about 1000 hours or more.

If the die seal 248, and also the passivation layer 402 are intact, as shown in FIG. 4, substantially no moisture can reach the die seal leakage detection material 401 during the stress test so that no expansion of the die seal leakage detection material 401 is obtained.

After the stress test, an electrical test of the semiconductor structure 400 may be performed. The electrical test may be performed in accordance with conventional techniques for the testing of integrated circuits. In the test, it may be determined if the circuit formed by the circuit elements provided at the substrate 101, which include, for example, the transistor 102 and the electrical connections in the interconnect layers 201 to 205 provided by the contact holes 110, 111, the contact vias 206 to 217 and the trenches 218 to 229, has the desired functionality.

In some cases, the die seal 248 is not intact and has a defect. As an example of a defect, FIG. 5 shows a situation wherein the semiconductor structure 400 has a defect 501 that includes a delamination between the interconnect layers 243, 244 in the die seal area 115.

When the defect 501 is present and the semiconductor structure 400 is exposed to moisture 403 during the stress test, the moisture 403 can reach the die seal leakage detection material 401 through the defect 501. Thus, the die seal leakage detection material 401 may absorb water. As detailed above, the absorption of water by the die seal leakage detection material 401 can lead to a creation of stress by the die seal leakage detection material 401 and/or an expansion of the die seal leakage detection material 401. As shown in FIG. 6, which shows a state of the semiconductor structure 400 having a defect 501 as shown in FIG. 5 after the stress test, this can entail a formation of cracks 601, 602 in the semiconductor structure 400, that can be associated with defects of the electrical connections 247 in the interconnect layers 201 to 205. As an example of possible defects in the electrical connections 247, FIG. 6 shows a disconnection of the contact vias 208, 209, 210 which are filled with metal from the metal-filled trenches 218, 219 so that there is no electrical connection between the trenches 220, 221 and the trench 218 and no electrical connection between the trench 222 and the trench 219, which is different from the situation in the intact electrical circuit as illustrated in FIG. 4.

The presence of defects in the electrical connections 247 may be detected when the electrical test of the semiconductor structure 400 is performed after the stress test. Typically, the disconnection of a part of the electrical connections 247 will lead to a total or partial loss of the functionality of the circuit, which can easily be detected.

Accordingly, a semiconductor structure 100, 400 as disclosed herein allows an early detection of defects in the die seal 248 by means of a stress test and an electrical test which may be performed, for example, at the foundry where the manufacturing of the semiconductor structure 100, 400 is performed, prior to the shipment of a product including the semiconductor structure 400. This may help to improve a quality of products including the semiconductor structure 400 and reduce field returns.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A semiconductor structure, comprising:
   a semiconductor substrate;
   one or more interconnect layers provided over said substrate;
   a circuit, said circuit comprising a plurality of circuit elements formed on said substrate and a plurality of electrical connections provided in said one or more interconnect layers;
   a die seal provided in said one or more interconnect layers, said die seal surrounding at least said plurality of electrical connections of said circuit; and
   a die seal leakage detection material arranged in a trench extending through said one or more interconnect layers between said die seal and said plurality of electrical connections, wherein said trench surrounds at least said plurality of electrical connections of said circuit, said die seal provides a protection of said die seal leakage detection material from moisture if said die seal is intact, and said die seal leakage detection material comprises an insulating material configured to expand after said exposure of said die seal leakage detection material to moisture to provide a detectable modification of said circuit after an exposure of said die seal leakage detection material to moisture.

2. The semiconductor structure of claim 1, wherein said detectable modification of said circuit is detectable by an electrical test of said circuit.

3. The semiconductor structure of claim 2, wherein said detectable modification of said circuit comprises at least one defect of said circuit.

4. The semiconductor structure of claim 3, wherein an expansion of said die seal leakage detection material creates said at least one defect of said circuit.

5. The semiconductor structure of claim 1, wherein said semiconductor structure further comprises a passivation layer provided over said trench.

6. The semiconductor structure of claim 5, wherein said trench extends substantially from said substrate into a top interconnect layer, said top interconnect layer being one of said one or more interconnect layers that is arranged at a greatest distance to said substrate.

7. The semiconductor structure of claim 6, wherein said die seal leakage detection material comprises a polyimide.

8. The semiconductor structure of claim 7, wherein said die seal comprises one or more trenches formed in said one or more interconnect layers, said one or more trenches being filled with a metal.

9. A semiconductor structure, comprising:
a semiconductor substrate;
one or more interconnect layers provided over said substrate;
a circuit, said circuit comprising a plurality of circuit elements formed on said substrate and a plurality of electrical connections provided in said one or more interconnect layers;
a die seal provided in said one or more interconnect layers, said die seal surrounding at least said plurality of electrical connections of said circuit; and
a die seal leakage detection structure comprising an insulating material that expands when exposed to moisture disposed in a trench extending through said one or more interconnect layers, said due seal leakage detection structure being positioned between said circuit and said die seal and surrounding at least said plurality of electrical connections of said circuit.

10. The semiconductor structure of claim 9, wherein a bottom of said die seal leakage detection structure contacts said substrate.

11. The semiconductor structure of claim 9, wherein a bottom of said die seal leakage detection structure is positioned above an upper surface of said substrate.

12. The semiconductor structure of claim 9, wherein said die seal leakage detection structure extends substantially from said substrate into a top interconnect layer, said top interconnect layer being one of said one or more interconnect layers that is arranged at a greatest distance from said substrate.

13. The semiconductor structure of claim 9, wherein said die seal leakage detection material comprises a polyimide.

14. The semiconductor structure of claim 9, wherein said semiconductor structure further comprises a passivation layer provided above said die seal leakage detection structure.

15. The semiconductor structure of claim 9, wherein said die seal comprises one or more trenches formed in said one or more interconnect layers, said one or more trenches being filled with a metal or a metal compound.

16. The semiconductor structure of claim 9, wherein, when viewed from above, said die seal and said die seal leakage detection structure have a generally rectangular configuration.

* * * * *

UNITED STATES PATENT AND TRADEMARK OFFICE
CERTIFICATE OF CORRECTION

PATENT NO. : 9,455,232 B2
APPLICATION NO. : 14/515986
DATED : September 27, 2016
INVENTOR(S) : Thomas Werner et al.

Page 1 of 1

It is certified that error appears in the above-identified patent and that said Letters Patent is hereby corrected as shown below:

In the Claims

Column 13, Line 24 (Claim 9, Line 15), change "due" to "die".

Signed and Sealed this
Tenth Day of January, 2017

Michelle K. Lee
*Director of the United States Patent and Trademark Office*